United States Patent [19]

Coates et al.

[11] Patent Number: 5,035,316

[45] Date of Patent: Jul. 30, 1991

[54] ISOLATING A FIRST COMPONENT TO BE PICKUP FROM OTHER COMPONENTS ON A VIBRATORY FEEDER

[75] Inventors: Carl T. Coates; Dennis G. Boucher, both of Binghamton, N.Y.

[73] Assignee: Universal Instruments Corporation, Binghamton, N.Y.

[21] Appl. No.: 467,406

[22] Filed: Jan. 22, 1990

[51] Int. Cl.⁵ .............................................. B65G 47/26
[52] U.S. Cl. .................................. 198/459; 198/419.1
[58] Field of Search ............... 198/418.1, 419.1, 419.2, 198/432, 433, 459, 461.2; 221/290, 292, 293, 289, 298, 251

[56] References Cited

U.S. PATENT DOCUMENTS

| | | | |
|---|---|---|---|
| 3,237,365 | 3/1966 | Koulakoff et al. | 198/419.1 X |
| 3,651,985 | 3/1972 | Smith | 198/464.2 X |
| 3,826,348 | 7/1974 | Preisig et al. | 198/419.1 X |
| 3,900,132 | 8/1975 | Kuehn et al. | 221/251 |
| 4,282,966 | 8/1981 | Bates et al. | |
| 4,377,368 | 3/1983 | Koch | 221/251 X |
| 4,423,807 | 1/1984 | Muller | 198/459 X |
| 4,434,887 | 3/1984 | Yager | 198/391 |
| 4,553,660 | 11/1985 | Bennett et al. | 198/419.1 X |
| 4,740,136 | 4/1988 | Asai et al. | |
| 4,754,865 | 7/1988 | Szumierz et al. | 198/459 X |

Primary Examiner—D. Glenn Dayoan
Attorney, Agent, or Firm—Fidelman & Wolffe

[57] ABSTRACT

The component at the pick-up station of a vibratory feeder is isolated from the remaining components on the feeder by backing the remaining components away from the component to be picked up in preparation for removal of the component from the feeder at the pick-up station. A shutter can be positioned over the component at the pick-up station prior to lowering the vacuum spindle into contact with the component so as to prevent loss of the component from the pick-up station of the feeder. The shutter may also have a slot therein to allow a spindle to pass through the shutter and contact a component in the pick-up station prior to withdrawal of the shutter, thus eliminating "teepeeing" of two components which can cause sufficient inaccuracies in pickup and subsequent placement of the component. Additionally, the vibrator may be halted for the brief period necessary to remove the component from the pick-up station.

8 Claims, 6 Drawing Sheets

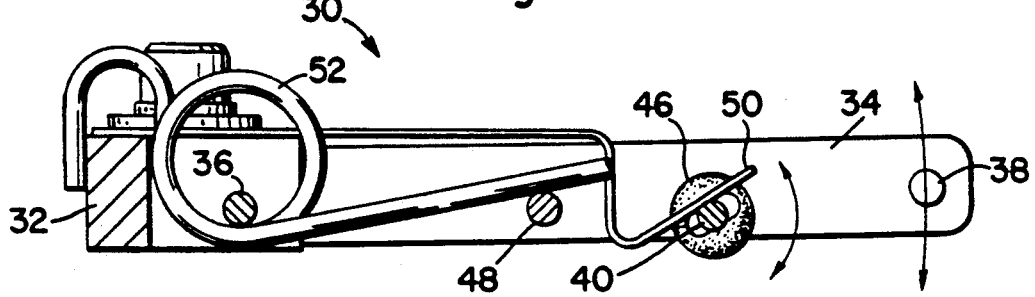
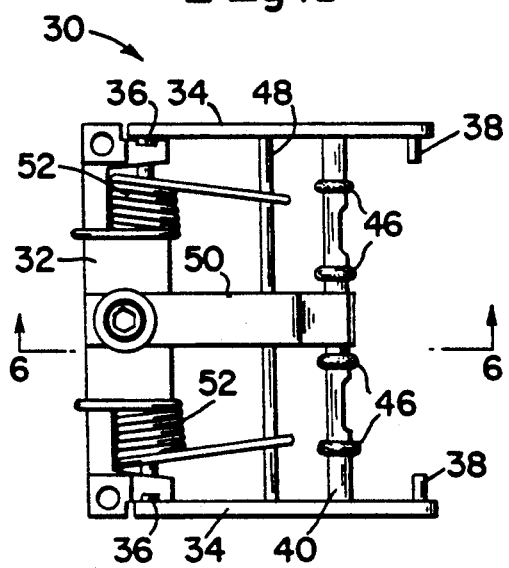
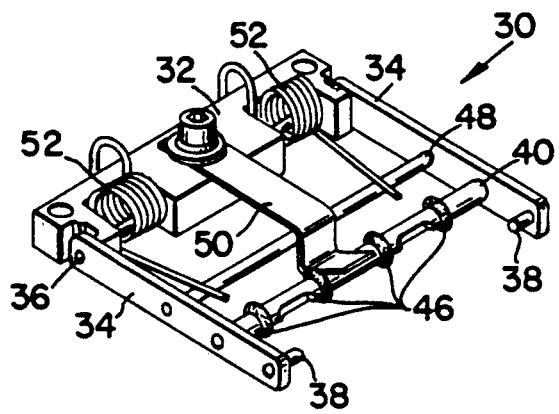
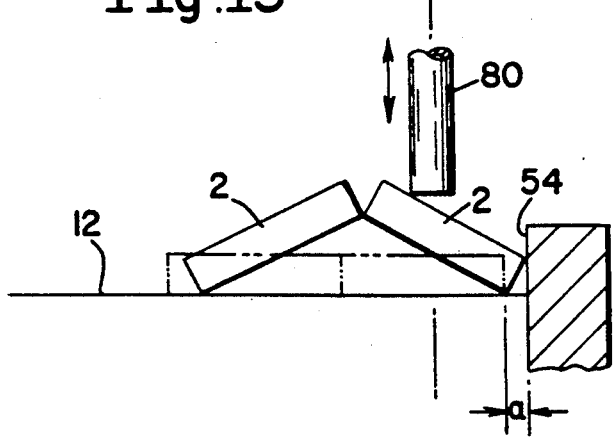

ISOLATING A FIRST COMPONENT TO BE PICKUP FROM OTHER COMPONENTS ON A VIBRATORY FEEDER

PRIOR ART CROSS REFERENCES

U.S. Pat. No. 4,282,966 —FEEDING AND ORIENTING DEVICE, issued Aug. 11, 1981 to Bates et al.

U.S. Pat. No. 4,434,887 —ISOLATED STOP FOR VIBRATING FEEDERS, issued Mar. 6, 1984 to Yager.

U.S. Pat. No. 4,740,136 —METHOD AND APPARATUS FOR TAKING ELECTRONIC COMPONENT OUT OF CARRIER TAPE, issued Apr. 26, 1988 to ASAI et al.

BACKGROUND OF THE INVENTION

The invention is in the field of electrical component handling wherein a line of components is fed vibrationally to present a front component to a pick-up station at which the component is removed from the vibratory feeder by means of a vacuum spindle or the like.

A typical component being so handled often times has "flashing" around the body thereof, with such flashing resulting from the moldable material that gets into the parting line along which two mold halves are separated after molding of the component body is complete. Thus, flashing or a flange can protrude outwardly from the body of the component and interfere with proper extraction of the component from the pick-up station of the feeder. For instance, it is sometimes the case that the horizontally protruding flange of the component at the pick-up station is overlapped by the horizontally protruding flange or flashing of the following component so that the flashing of the following component interferes with proper extraction of the component at the pick-up station by a vacuum spindle or the like.

Additionally, even when the components do not have such a "flashing", the horizontal pressure applied to the lead component, by the following line of components which are being vibratorally fed to the pick-up station, may be sufficient to interfere with proper extraction of the component by a vacuum pick-up nozzle.

Still further, the constant, although small, vibration of a component against the stop means while at the pick-up station can cause inaccuracies in the pick-up of some components and result in corresponding inaccuracies during subsequent placement of the component onto a circuit board.

Thus, it is an object of the instant invention to eliminate or reduce the effects of such vibration or hammering on the component that is in the pick-up station.

Additionally, it is an object of the invention to eliminate problems in proper extraction of the component from the pick-up station which are caused by friction and/or flashing protruding from the component body.

Still further, it is an object of the invention to provide an additional degree of control over the component at the pick-up station until contact of the vacuum spindle with the component.

These and other objects of the invention will become more apparent from the detailed disclosure of the invention which follows.

SUMMARY OF THE INVENTION

The component at the pick-up station of a vibratory feeder is isolated from the remaining components on the feeder by backing the remaining components away from the component to be picked up in preparation for removal of the component from the feeder at the pick-up station. A shutter can be positioned over the component at the pick-up station prior to lowering the vacuum spindle into contact with the component so as to prevent loss of the component from the pick-up station of the feeder. The shutter may also have a slot therein to allow a spindle to pass through the shutter and contact a component in the pick-up station prior to withdrawal of the shutter, thus eliminating "teepeeing" of two components and the resultant inaccuracies in pick-up of the component and subsequent placement of the component on a circuit board. Additionally, the vibrator may be halted for the brief period necessary to remove the component from the pick-up station.

BRIEF DESCRIPTION OF THE DRAWINGS

FIG. 6 is a cross-section as viewed generally in the directions of arrows 6—6 of FIG. 7.

FIG. 7 is a top plan view of the isolator assembly.

FIG. 8 is an isometric view of the isolator assembly.

FIG. 13 is a fragmentary view illustrating "teepeeing" of the front two components of a line of components when no shutter is provided.

DETAILED DESCRIPTION OF THE INVENTION

Figure 3:
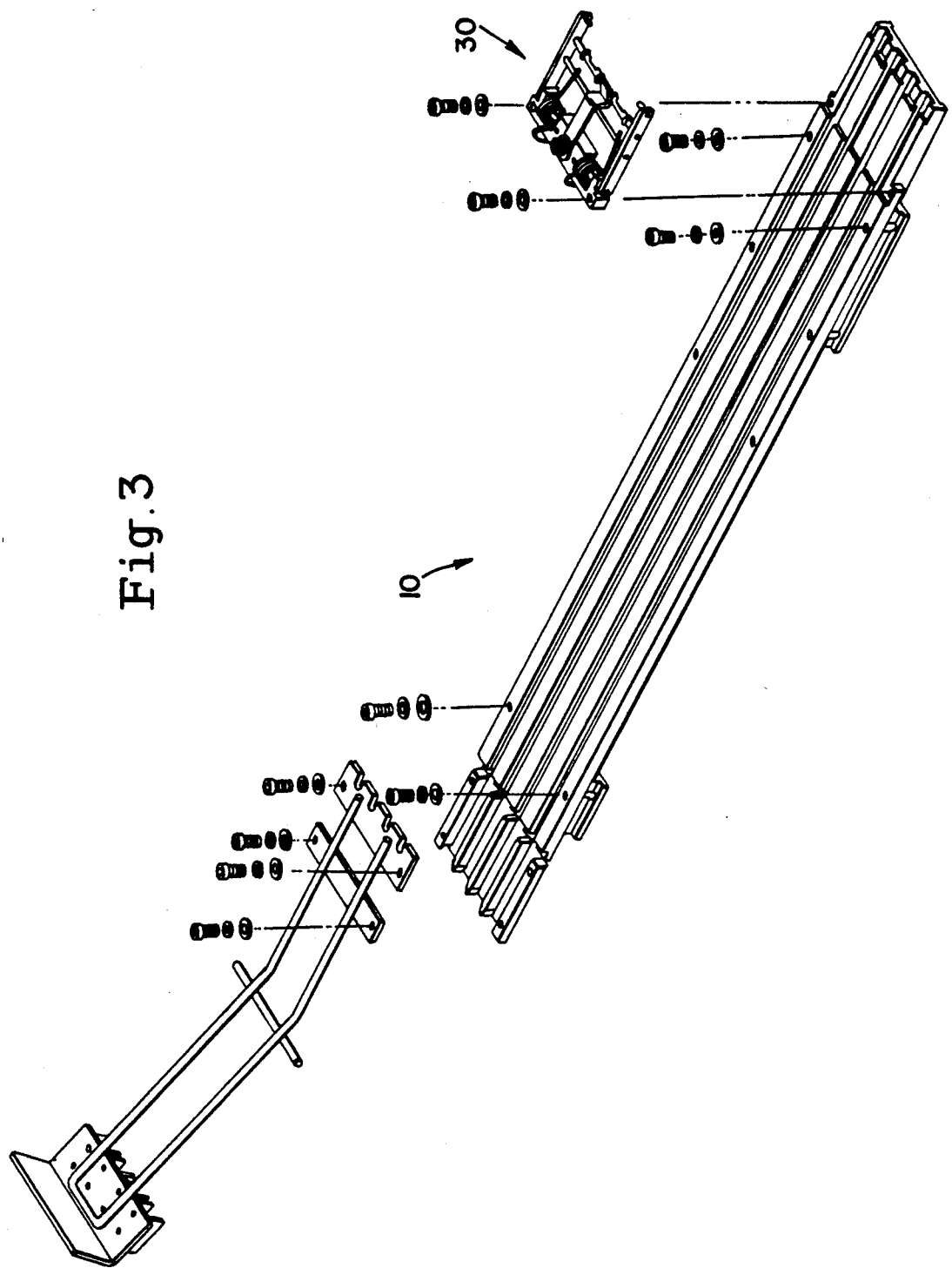
FIG. 3 is an exploded isometric view of the feeder assembly and isolator assembly, without showing the shutter assembly.
Figure 5:
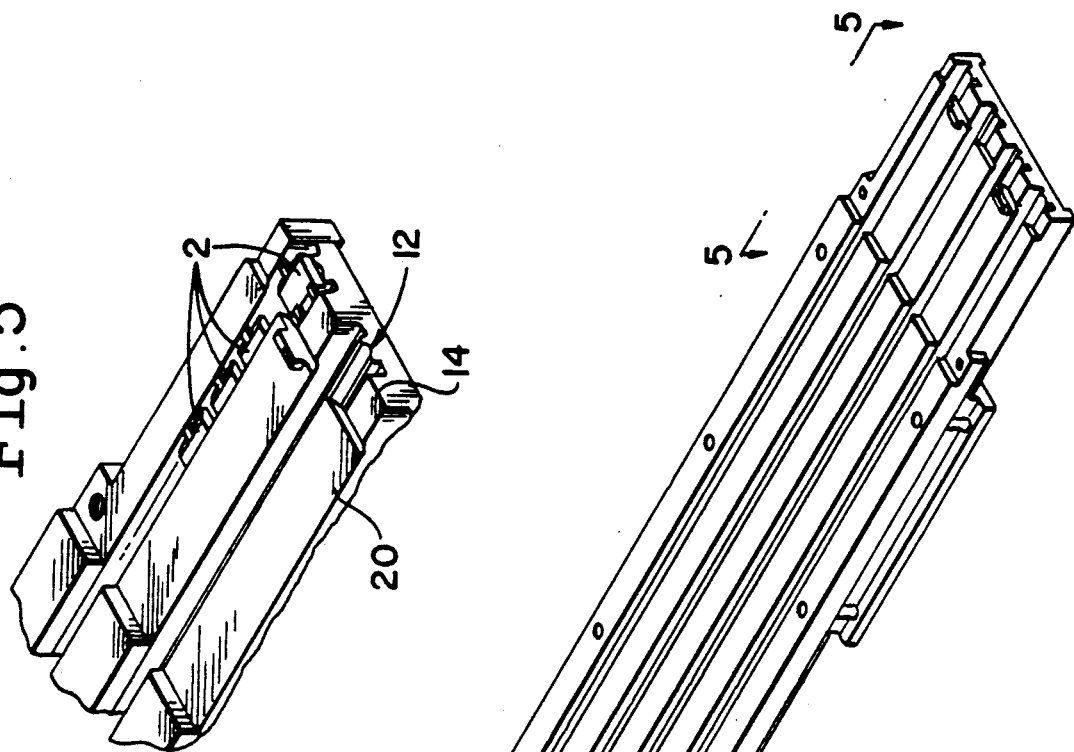
FIG. 5 is an enlarged fragmentary view of the front end of the feeder assembly of FIG. 4 with the addition of a component at the pick-up station and three more components lined up therebehind on one of the tracks of the feeder assembly.
Figure 4:
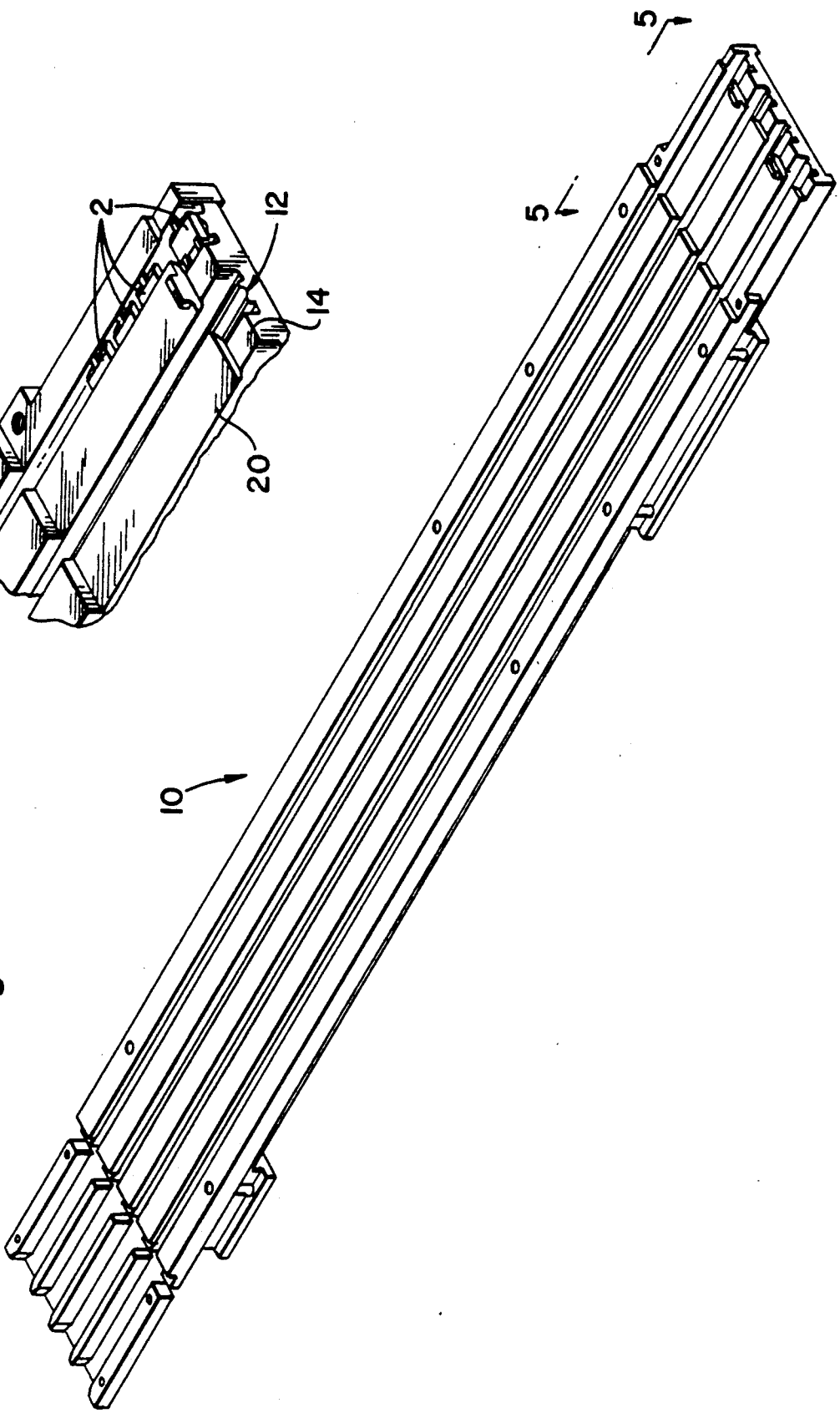
FIG. 4 is an isometric view of the feeder assembly.
Figure 9:
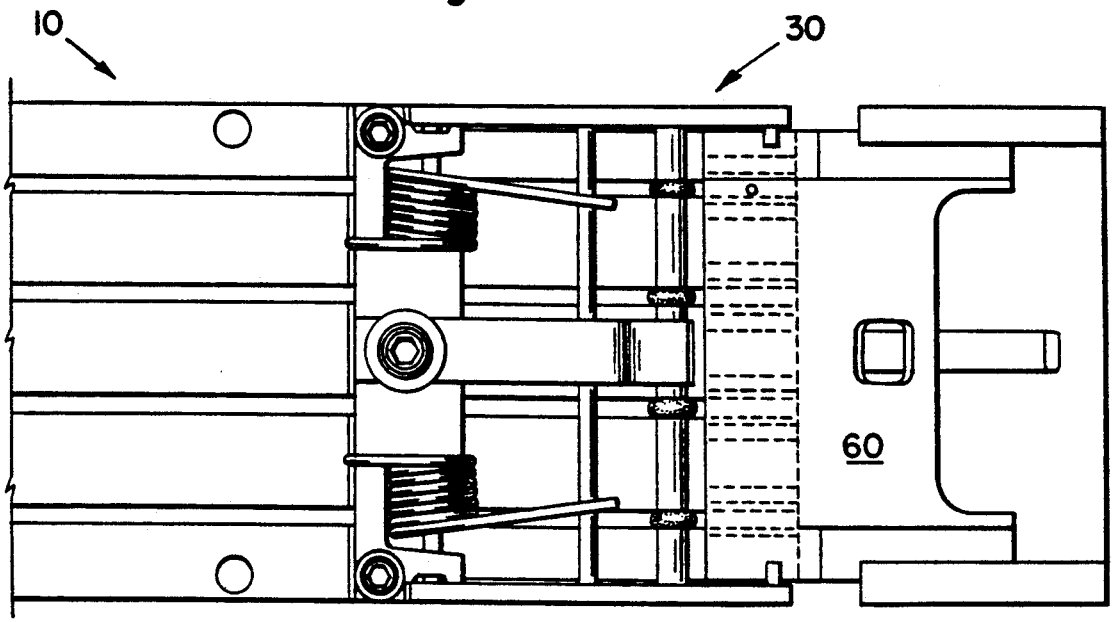
FIGS. 9 and 10 are top plan views illustrating the shutter in the closed and open positions, respectively and a component at a pick-up position.
Figure 10:
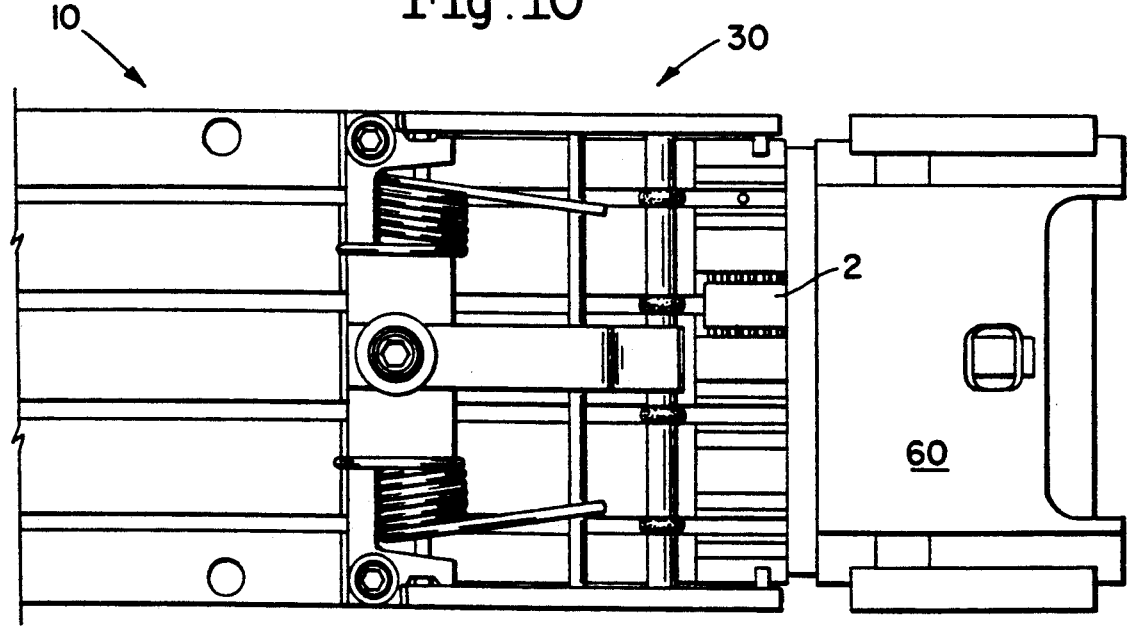

Referring to FIGS. 3-5, the track assembly 10 of a vibratory feeder handles four lines of components being fed to the right as viewed in the figures by means of a vibrator mechanism (not shown). As seen in FIG. 5 the foremost or leading component of a line of components is located at a pick-up station.

Figure 1:
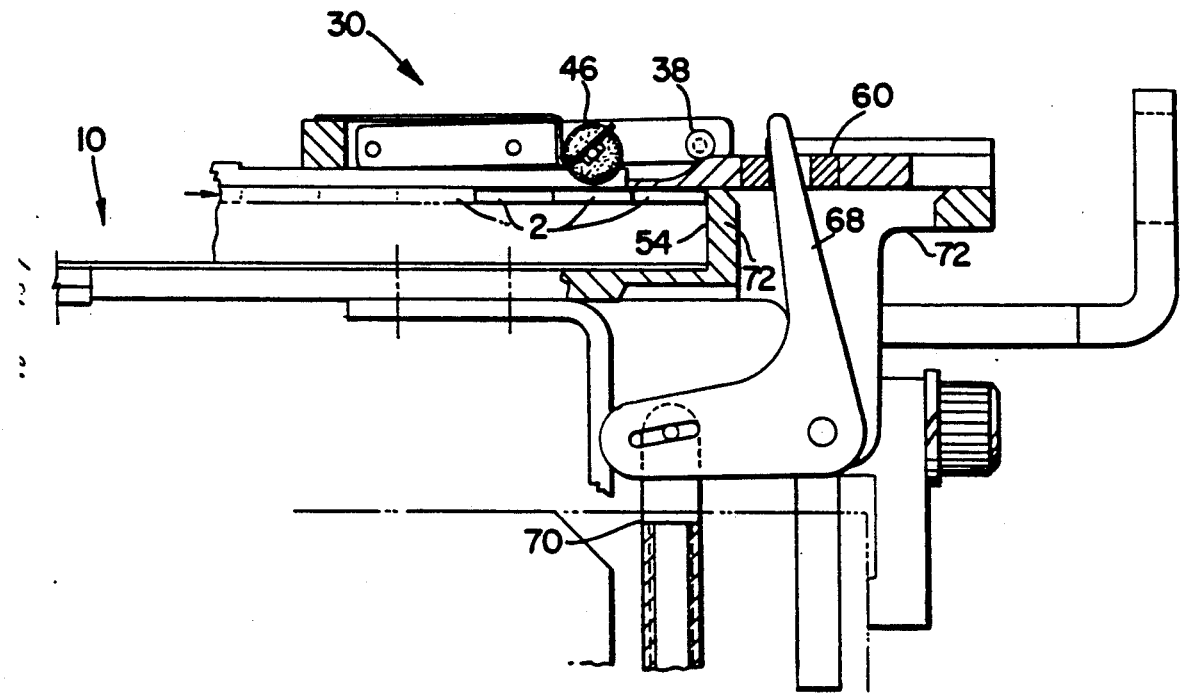
FIGS. 1 and 2 are cross-sectional views showing the shutter in the closed and open positions, respectively.
Figure 2:
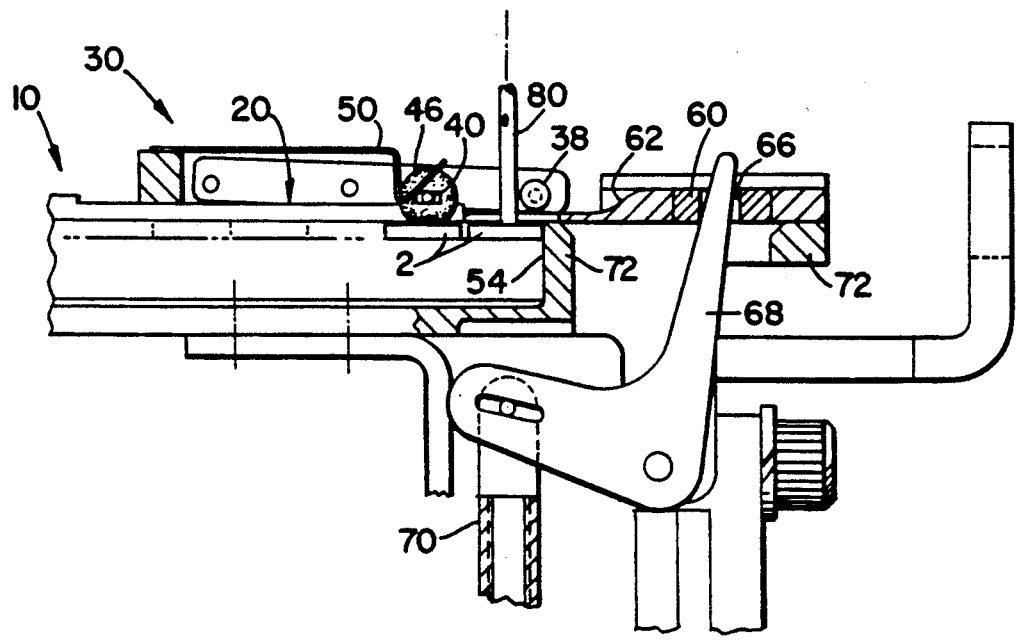

Referring to FIGS. 1 and 2, the leading component of the line of components abuts a surface 54 at the pick-up station. Surface 54 is part of a shutter assembly comprising a bracket 72 and shutter 60 which is reciprocatable back and forth within bracket 72 according to actuation of link member 68. Link 68 protrudes up through an opening 66 and reciprocates shutter 60 according to vertical reciprocation of an actuating rod 70. During closing of the shutter 60, a ramp surface 62 engages lifting pins 38 of an isolator assembly 30.

As seen in FIGS. 6-8, isolator assembly 30 consists of a base member 32 which is attached (according to FIG. 3) to the feeder track 10 and has side arms 34 pivotally attached thereto at 36. A rod 48 is attached to pivotal arms 34 and is situated such that springs 52 are engagable therewith to bias arms 34 in the clock-wise direction (as viewed in FIG. 6). Also spanning the pivotal arms 34 is a rotatable cross bar 40 with compressible o-rings 46 mounted thereon so that the rings 46 are rotatable with, rather than relative to, cross bar 40.

Also attached to base member 32 is a stop member 50 which provides for and limits counterclockwise rotation of cross bar 40 during lifting of the isolator assembly 30 by ramp portion 62 during closing of the shutter 60. The top surface 20 of a rail 14 (as seen in FIG. 5) provides for and limits clockwise rotation of cross bar 40 when isolator assembly 30 is in the lowered position of FIG. 2.

In other words, the flat upper surface of cross bar 40 engages the angled surface of stop member 50 when isolator assembly 30 is in the raised position of FIG. 1, and the lower flat surface of cross bar 40 engages surface 20 of rail 14 when the isolator assembly is in the lowered position of FIG. 2. Thus, as can be appreciated, the cross bar 40, and o-rings attached thereto, are rotated approximately 45° in the counterclockwise direction from the position of FIG. 2 to the position of FIG. 1 by the angled surface of member 50 during closing of shutter 60. During opening of shutter 60, the flat undersurface of cross bar 40 is urged into engagement with flat surface 20 and rotates clockwise by about 45° due to such engagement.

During lowering of arms 34 from the position of FIG. 1 to the position of FIG. 2, an o-ring 46 compressibly engages the second component 2 in the line and rotates about 45° with cross bar 40 in the clockwise direction such that the second component 2 in the line of components is retracted away from the leading component which is at the pick-up station. In this manner, the component at the pick-up station is isolated from the remainder of components in the line, so as to eliminate any friction therebetween during removal of a component from the pick-up station and also to eliminate the possibility of overlapping flashings protruding from the bodies of the components which could cause loss of control of the component during removal from the pick-up station by a vacuum spindle 80.

Figure 11:
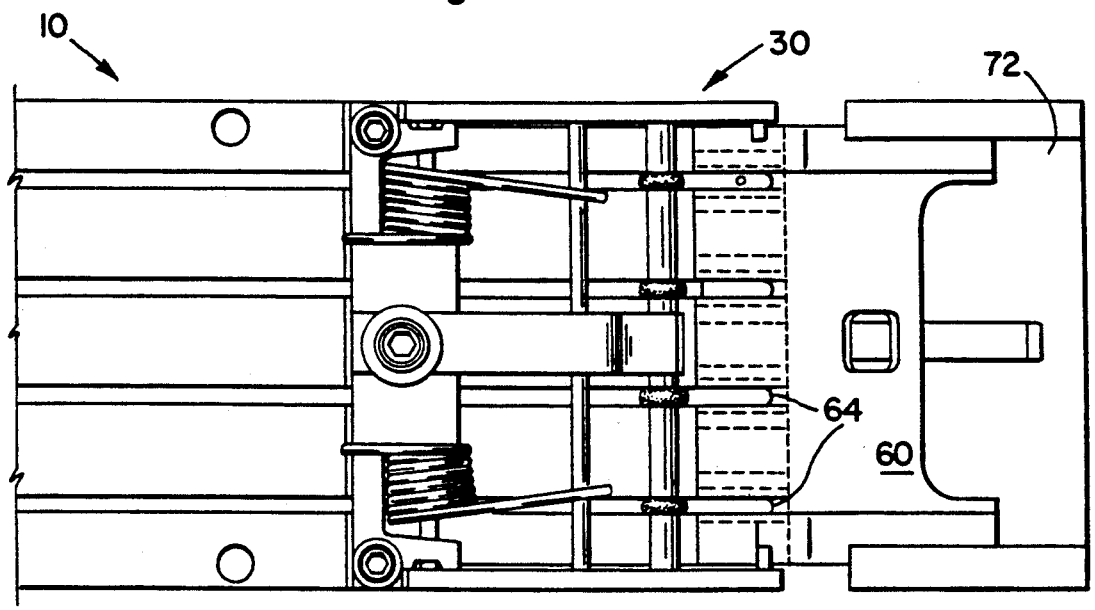
FIGS. 11 and 12 are top plan views illustrating a preferred, slotted shutter in the closed and open positions, respectively.
Figure 12:
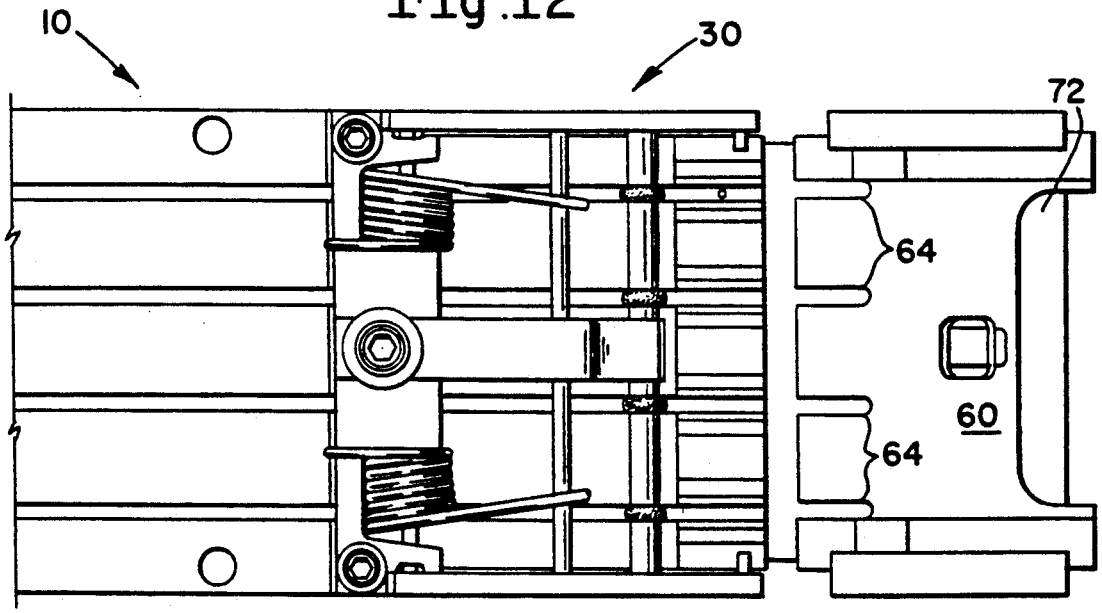

A preferred embodiment of the shutter assembly is illustrated in FIGS. 11 and 12 from which it may be seen that slots 64 are provided in shutter 60 and are of sufficient size that a vacuum spindle 80 can pass through each slot 64 and engage a component 2 which is located at the pick-up station while shutter 60 is in the closed position of FIG. 11.

The slotted shutter 60 of FIGS. 11 and 12 insures that the component at the pick-up station is uncovered only after the vacuum spindle has been lowered into engagement with the component to effect control thereof.

The slotted shutter 60 of FIGS. 11 and 12 also overcomes a "teepeeing" problem that can occur, as seen in FIG. 13, when the abutting end of each of two adjacent components can rise up to slightly resemble a teepee, albeit a rather flattened one.

This teepeeing action has been found to result in inaccuracies of pick-up of the component 2 due to the longitudinal axis of the vacuum spindle 80 contacting the top surface of the component 2 in a non-reliable location. In other words, the distance between stop surface 54 and the longitudinal axis of vacuum spindle 80 is fixed so that the location at which the vacuum spindle 80 will contact the top surface of a component 2 abutted up against surface 54 is predictable, thus allowing for precise, subsequent placement of the component 2 onto a circuit board location. However, when a vacuum spindle 80 is lowered into contact with the front component 2 of a teepee situation it has been found that the front component rotates about the lower right edge thereof to the phantom line position illustrated in FIG. 13, so that the predictability of the point of contact of the vacuum spindle 80 with top surface of the component is off by an amount "a".

The above referenced U.S. Pat. No. 4,740,136 discloses a slotted shutter for covering an opened pocket of a taped supply on a tape feeder.

It also has been found to be advantageous to eliminate any bumping or jittering of the component at the pick-up station against surface 54 by turning off the vibrator for the instant just before and during engagement of the vacuum spindle 80 with the top portion of the component.

Typical of the type of component handled by the apparatus of the instant invention are leadless microcapacitors and electrical components referred to in the industry as SOIC's and SOT's, and PLCC's (plastic leadless chip carriers).

Although the drawings illustrate the inventive concept applied to the guide shelf or track of a linear vibratory feeder, it is considered to be well within the scope of the invention to adapt such structure to bowl-type vibratory feeders. Further, it is contemplated that the method of removing the pressure of a following component from a leading component by backing the following component off of the leading component could be applied to devices that feed by means other than vibratorily, such as gravity feed, and that such an isolating means could also be adapted to dispensers which dispense a column of components under the influence of a spring feed or a gravity feed or the like.

Having described the invention, it will be seen that the objects set forth above and made apparent from the preceding description are efficiently obtained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Now that the invention has been described, We claim:

1. In an apparatus for feeding a line of juxtaposed components and presenting a first component of said line to a removal station for subsequent removal therefrom, the improvement comprising:
   means for moving a second component of said line away from said first component by an amount sufficient to avoid instances of friction and interference between said first and second components during said removal;
   said moving means comprising a wheel engagable with said second component and means, separate from said components, for positively rotating said wheel a particular amount in one direction when said wheel is engaging said second component, in order to effect moving of said second component away from said first component.

2. An improvement as in claim 1, wherein said moving means comprises:

means for moving said second component in a reverse direction along a path of said feeding in order to avoid said friction and interference.

3. An improvement as in claim 1, and further comprising:
   means for disengaging said wheel from said second component such that said feeding is recommenceable.

4. The improvement as in claim 1, and further comprising:
   means for biasing said wheel into engagement with said second component.

5. The improvement as in claim 3, and further comprising:
   means for biasing said wheel into engagement with said second component.

6. The improvement as in claim 1, and said wheel further comprising:
   a compressible material which compresses with engagement thereof with said component.

7. In a method of feeding a line of juxtaposed components and presenting a first component of said line to a removal station and removing said first component, the improvement comprising the steps of:
   moving a second component of said line away from said first component by an amount sufficient to avoid instances of friction and interference between said first and second components during said removing;
   providing a shutter and covering said removal station sufficiently with said shutter to retain said first component in said removal station in a preferred orientation for said removing;
   providing access through said shutter for a means for removing said first component from said removal station during said covering;
   passing said removing means through said shutter access and into said removal station and into engagement with said first component;
   moving said shutter and uncovering said removal station prior to removing said removing means therefrom; and
   removing said first component from said station via said removing means.

8. In an apparatus for feeding a line of juxtaposed components and presenting a first component of said line to a removal station for subsequent removal therefrom, the improvement comprising:
   means for moving a second component of said line away from said first component by an amount sufficient to avoid instances of friction and interference between said first and second components during said removal;
   shutter means for covering said removal station sufficiently to retain said first component in said removal station in a preferred orientation for said removal;
   means for removing said first component from said removal station by entering said removal station and engaging said first component;
   access means for providing access to said removing means through said shutter means;
   means for passing said removing means through said shutter access means and into engagement with said component in said removal station; and
   means for moving said shutter means and uncovering said removal station prior to removing said removing means therefrom.

* * * * *